United States Patent [19]
Corisis et al.

[11] Patent Number: 6,133,622
[45] Date of Patent: *Oct. 17, 2000

[54] HIGH SPEED IC PACKAGE CONFIGURATION

[75] Inventors: David J. Corisis, Meridian; Brent Keeth, Boise, both of Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 09/001,638

[22] Filed: Dec. 31, 1997

Related U.S. Application Data

[62] Division of application No. 08/784,362, Jan. 17, 1997.

[51] Int. Cl.[7] .................................................. H01L 23/495
[52] U.S. Cl. ......................... 257/666; 257/786; 257/676
[58] Field of Search ...................................... 257/678, 666, 257/787, 786, 784, 676

[56] References Cited

U.S. PATENT DOCUMENTS

| | | |
|---|---|---|
| 5,147,815 | 9/1992 | Casto . |
| 5,233,220 | 8/1993 | Lamson et al. .......................... 257/784 |
| 5,290,735 | 3/1994 | Haley . |
| 5,304,843 | 4/1994 | Takubo et al. . |
| 5,358,904 | 10/1994 | Murakami et al. ...................... 437/209 |
| 5,409,866 | 4/1995 | Sato et al. . |
| 5,447,888 | 9/1995 | Takashima et al. . |
| 5,480,841 | 1/1996 | Bickford et al. . |
| 5,583,370 | 12/1996 | Higgins, III et al ..................... 257/684 |
| 5,766,975 | 6/1998 | Templeton, Jr. et al. . |

*Primary Examiner*—Carl Whitehead, Jr.
*Assistant Examiner*—Roy Potter
*Attorney, Agent, or Firm*—Trask, Britt & Rossa

[57] ABSTRACT

Devices and methods for reducing lead inductance in integrated circuit (IC) packages. More specifically to an integrated circuit package configuration for high speed applications where the inductance of the leads is reduced or minimized in high capacity semiconductor device packages. The integrated circuit package assembly comprises a substrate, semiconductor device, insulating covering or coating, if desire, a semiconductor device retainer, lead frame, and wire bond interconnections.

9 Claims, 11 Drawing Sheets

HIGH SPEED IC PACKAGE CONFIGURATION

This application is a divisional application of Ser. No. 08/784,362, filed on Jan. 17, 1997.

BACKGROUND OF THE INVENTION

1. Field of the Invention

The present invention relates in general to devices and methods for reducing lead inductance in integrated circuit (IC) packages and, more specifically, to an integrated circuit package configuration for high speed applications where the inductance of the leads is reduced or minimized in high capacity semiconductor device packages.

2. State of the Art

Integrated circuit (IC) packages typically contain small, generally rectangular integrated circuits referred to as IC "dice" or "chips." These IC dice come in an almost infinite variety of forms, including, for example, Dynamic Random Access Memory (DRAM) dice, Static Random Access Memory (SRAM) dice, Synchronous DRAM (SDRAM) dice, Sequential Graphics Random Access Memory (SGRAM) dice, flash Electrically Erasable Programmable Read-Only Memory (EEPROM) dice, and processor dice.

Packaged IC dice communicate with circuitry external to their packages through lead frames embedded in the packages. These lead frames generally include an assembly of leads that extend into the packages to connect to bond pads on the IC dice through thin wire bonds or other connecting means and extend from the packages to terminate in pins or other terminals that connect to the external circuitry. Exemplary conventional lead frames include paddle-type wire-bond lead frames, which include a central die support and leads which extend to the perimeter of IC dice and connect to the dice through thin wire bonds, Leads-Over-Chip (LOC) lead frames, having leads which extend over an IC die to attach to and support the die while being electrically connected to the die through wire bonds or other connecting means, and Leads-Under-Chip (LUC) lead frames, having leads which extend under an IC die to attach to and support the die from below while being connected to the die typically through wire bonds.

As with all conductors, the leads in lead frames have an inductance associated with them that increases as the frequency of signals passing through the leads increases. This lead inductance is the result of two interactions: the interaction among magnetic fields created by signal currents flowing to and from an IC die through the leads (known as "mutual" inductance); and the interaction between the magnetic fields created by the signal currents flowing to and from the IC die through the leads and magnetic fields created by oppositely directed currents flowing to and from ground (known as "self" inductance).

While lead inductance in IC packages for memory devices has not traditionally been troublesome because traditionally slow signal frequencies have made the inductance relatively insignificant, the ever-increasing signal frequencies of state of the art electronic systems have made lead inductance in IC packages significant. For example, overall performance of IC dice attached to leads in IC packages is slower than desirable because the inductance associated with the leads slows changes in signal current through the leads, causing signals to take longer to propagate through the leads. Also, digital signals propagating along the leads are dispersing (i.e., "spreading out") because the so-called "Fourier" components of various frequencies that make up the digital signals propagate through the inductance associated with the leads at different speeds, causing the components, and hence the digital signals themselves, to disperse along the leads, while mild dispersion can make the digital signals unrecognizable upon receipt. Impedance mismatches between the leads and IC dice or the leads and external circuitry, caused, in part, by the inductance associated with the leads, can distort normal signals propagating along the leads at the same time as the reflection signals. Further, magnetic fields created by signal currents propagating through the inductance associated with the leads can induce currents in nearby leads, causing so-called "crosstalk" noise on the nearby leads. While these various effects can be troublesome in any electronic system, the modern trend toward 3.3 volt systems and away from 5.0 volt systems only serves to make these effects more noticeable and significant. Also, the trend to ever increasing operating speeds for semiconductor devices further serves to make these effects more noticeable and significant. Particularly, such is present when the use of high density semiconductor devices operating at high frequencies requiring the use of packages having an increase number of connections to the semiconductor device is necessary.

Prior IC packages have been configured in an attempt to reduce various effects of lead inductance as described above. For example, U.S. Pat. No. 5,214,845, assigned to the assignee of the present invention, employs flexible, laminated sandwich assembly of an outer ground plane and an outer power plane dielectrically isolated from a series of conductive traces running therebetween. The traces and planes are connected to corresponding bond pads on an IC die at one end, and to leads on the other, as by thermocompression bonding (in the case of a TAB embodiment), or by wire bonds. Such an arrangement obviously doubles the number of required I/O connections by requiring two connections for each lead, and thus necessitates additional assembly time and increases the possibility of a faulty connection. Further, the flexible sandwich assembly constitutes an additional element of the package, increasing material cost.

Another approach to reducing the inductance effects described above is disclosed in U.S. Pat. No. 5,559,306, in which metal plates are employed above and below leads extending to the exterior of plastic and ceramic packages to effect reduction of self and mutual inductance. However, such configurations as disclosed appear to require relatively complex fabrication techniques to locate and fix the plates relative to the die and lead fingers or other conductors for subsequent transfer molding of a filled-polymer package thereabout, while the ceramic package embodiment is not cost-effective for high-volume, commercial packaging.

Accordingly, the inventors have recognized the need for a low-cost, reduced-inductance IC package configuration and readily-available materials, equipment, and fabrication techniques for semiconductor devices.

SUMMARY OF THE INVENTION

The present invention relates in general to devices and methods for reducing lead inductance in integrated circuit (IC) packages and, more specifically, to an integrated circuit package configuration for high speed applications where the inductance of the leads is reduced or minimized in high capacity semiconductor device packages. The integrated circuit package of the present invention comprises a substrate, semiconductor device, insulating covering or coating, if desired, a semiconductor device retainer, lead frame, and wire bond interconnections.

The present invention will be better understood when the drawings are taken in conjunction with the specification describing the invention hereafter.

DESCRIPTION OF THE INVENTION

Figure 1:
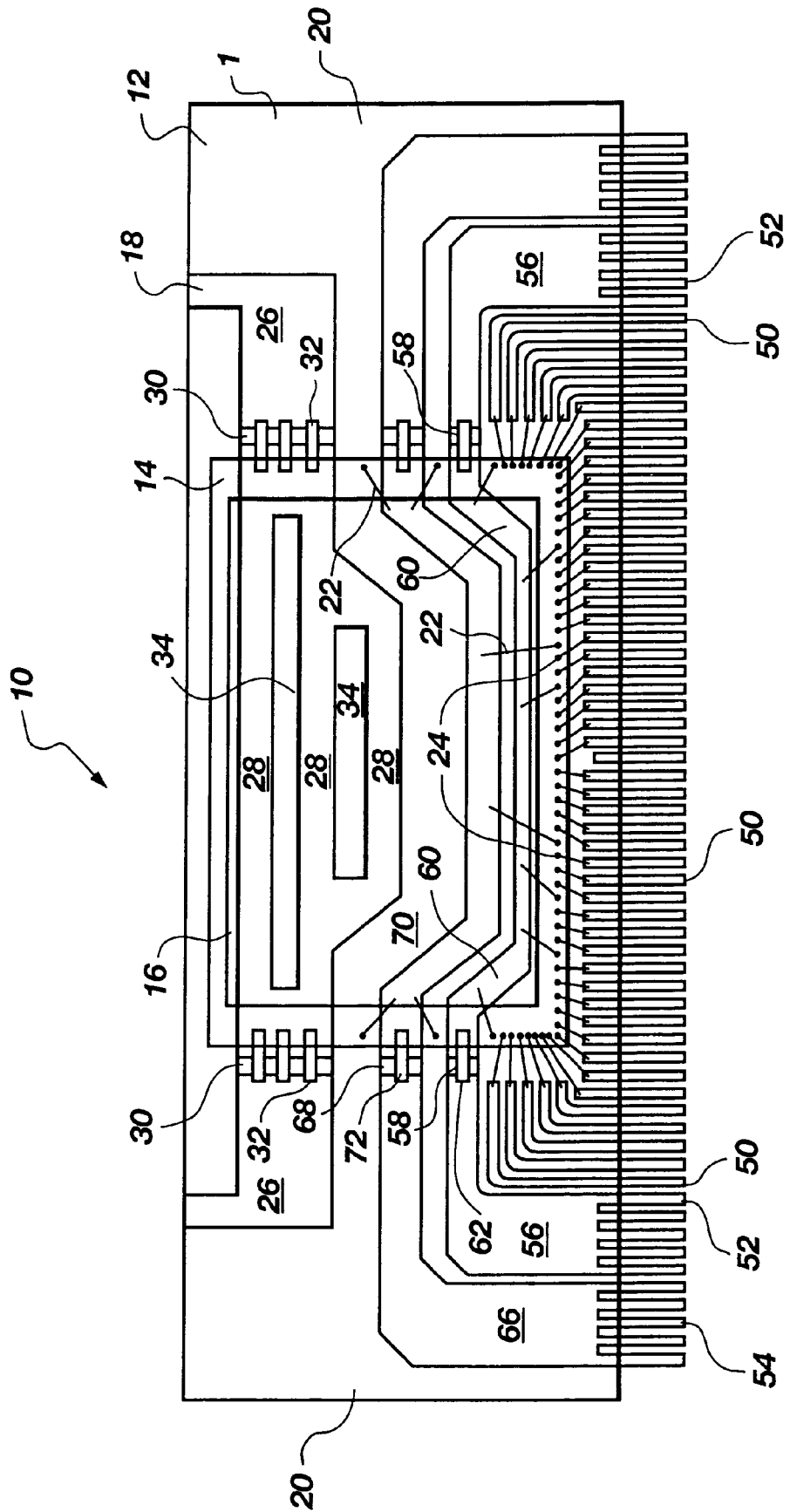
FIG. 1 is a side view of one side of a first embodiment of the present invention mounted in a vertical surface mount package.

Referring to drawing FIG. 1, the first side 1 of the integrated circuit package 10 of the present invention is shown in a vertical surface mount package configuration. The integrated circuit package 10 comprises a substrate 12, semiconductor device 14, insulating tape material 16, semiconductor device retainer 18, lead frame 20, and wire bond interconnections 22. As illustrated, the semiconductor device 14 is a modified Leads-Over-Chip (LOC) configuration with respect to the lead frame 20.

The substrate 12 comprises any suitable well known substrate for use with the semiconductor device 14. The semiconductor device 14 may be secured to the first side of the substrate 12 by any suitable means, such as adhesive attachment, if desired.

The semiconductor device 14 comprises any suitable type semiconductor device, such as Dynamic Random Access Memory (DRAM) dice, Static Random Access Memory (SRAM) dice, Synchronous DRAM (SDRAM) dice, Sequential Graphics Random Access Memory (SGRAM) dice, flash Electrically Erasable Programmable Read-Only Memory (EEPROM) dice, and processor dice. The semiconductor device 14 includes at least one or a plurality of bond pads 22 on the active surface thereof.

The insulating tape material 16 comprises any suitable well known type insulating tape which may be adhesively coated to secure portions of the lead frame 20 thereto and the insulating tape 16 to the semiconductor device 14. A suitable type insulating tape includes Kapton™ tape which may be adhesively coated on one or both sides thereof.

The semiconductor device retainer 18 comprises a u-shaped member having a first portion 26 thereof extending along the first side of the substrate 12 in contact therewith, a second raised portion 28 thereof extending over a portion of the semiconductor device 14 and a portion of the insulating tape 16, and a third transition portion thereof 30 connecting the first portion 26 and second raised portion 28. The third transition portion 30 may be of any desired length depending upon the thickness of the semiconductor device 14 and the insulating tape 16. To aid in forming the third transition portion 30 between the first portion 26 and second raised portion 28, one or more slotted openings 32 are included in the semiconductor device retainer 18. If desired, other openings 34 may be included in the second raised portion 28 to aid in the forming thereof. Further, if desired, the second raised portion 28 of the semiconductor retainer device 18 may be adhesively attached to the insulating tape 16 through the use of well known suitable adhesives.

The lead frame 20 comprises a first plurality of leads 50, a second plurality of leads 52 commonly connected over a portion of the length thereof, and a third plurality of leads 54 commonly connected over a portion thereof. As illustrated, the leads of the second plurality of leads 52 are commonly connected forming a unitary lead including a first portion 56 generally contacting the substrate 12, second transition portion 58 having, in turn, slotted opening 62 therein, and third semiconductor device portion 60. The third semiconductor device portion 60 of the second plurality of leads 52 is insulated from electrical contact with the active surface of the semiconductor device 14 by the insulating tape 16. As illustrated, the leads of the third plurality of leads 54 are commonly connected, forming a unitary lead including a first portion 66 generally contacting the surface of the substrate 12, a second transition portion 68 having slotted opening 72 therein, and third semiconductor device portion 70. The third semiconductor device portion 70 is insulated from the active surface of the semiconductor device 14 by the insulating tape 16. The transition portions 58 and 68 of the second plurality and third plurality of leads 52 and 54 may be any desired length depending upon the thickness of the semiconductor device 14 and the insulating tape 16. The third semiconductor device portions 60 and 70 of the second plurality and third plurality of leads 52 and 54, respectively, are adhesively secured to the insulating tape 16 through the use of well known suitable adhesives.

As illustrated, the second plurality of leads 52 and third plurality of leads 54 are used for the $V_{cc}$ and $V_{ss}$ functions of the semiconductor device 14. In this manner, by commonly connecting the second plurality of leads 52 and third plurality of leads 54 in areas except the portions of the leads which extend beyond the substrate 12, the impedance of the commonly connected leads is reduced, thereby allowing semiconductor devices 14 having higher operating frequencies to be used in the integrated circuit package 10. Also, by commonly connecting the second plurality of leads 52 and third plurality of leads 54 in areas except the portions of the leads which extend beyond the substrate 12, the impedance of the second plurality 52 and third plurality of 54 of leads is similar to that of the first plurality of leads 50.

A plurality of wire bond interconnections 22 interconnect the bond pads 24 on the active surface of the semiconductor device 14 and the first 50, second 52, and third 54 pluralities of leads. The wire bond interconnections 22 are made using suitable well known wire bonding devices.

Figure 2:
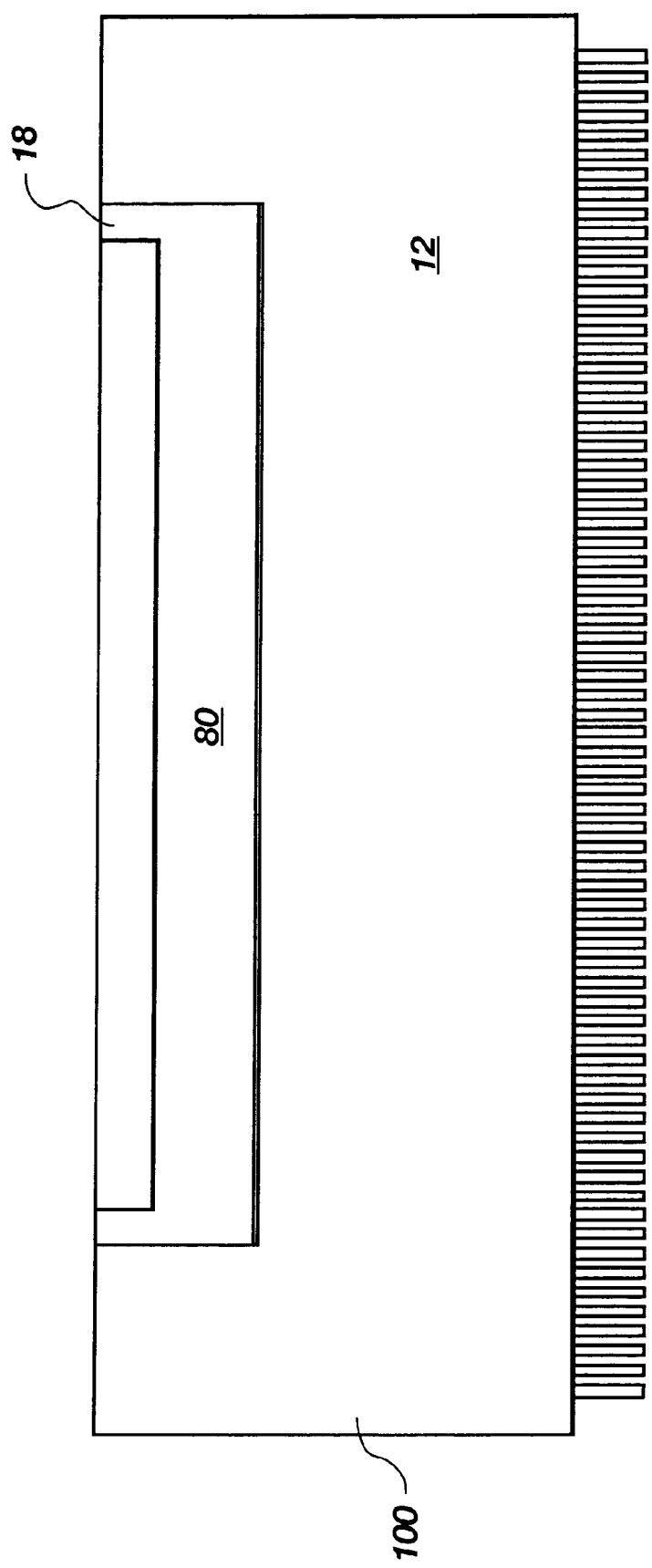
FIG. 2 is a side view of the other side of a first embodiment of the present invention mounted in a vertical surface mount package.

Referring to drawing FIG. 2, the second or other side 100 of the integrated circuit package 10 of the present invention is shown in a vertical surface mount package configuration. The other side of the u-shaped semiconductor device retainer 18 is illustrated in relation to the second or other side 100 of the substrate 12 integrated circuit package 10. The portion 80 of the semiconductor device retainer 18 resiliently engages the second side 100 of the substrate 12. If desired, the portion 80 may be secured to the substrate 12, such as by attachment with any suitable well known adhesive material.

Figure 3:
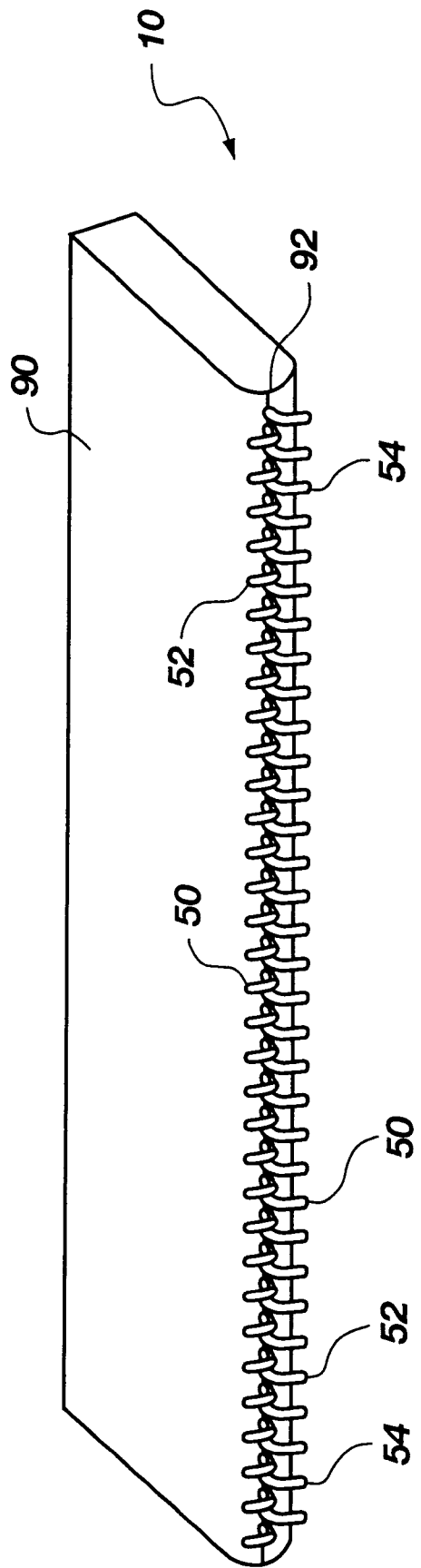
FIG. 3 is a perspective view of the present invention being encapsulated with the connectors of the lead frame extending therefrom.

Referring to drawing FIG. 3, the integrated circuit package 10 of the present invention in a vertical surface mount package configuration is shown encapsulated in encapsulation material 90. The encapsulation material 90 may be of any suitable well known type, such as plastic, plastic with filler material therein, etc. As illustrated, the connectors 50, 52, and 54 extend from the edge 92 of the encapsulating material 90 being deformed in opposite directions thereal-ong for subsequent connection to circuits of a printed circuit board (not shown).

Figure 4:
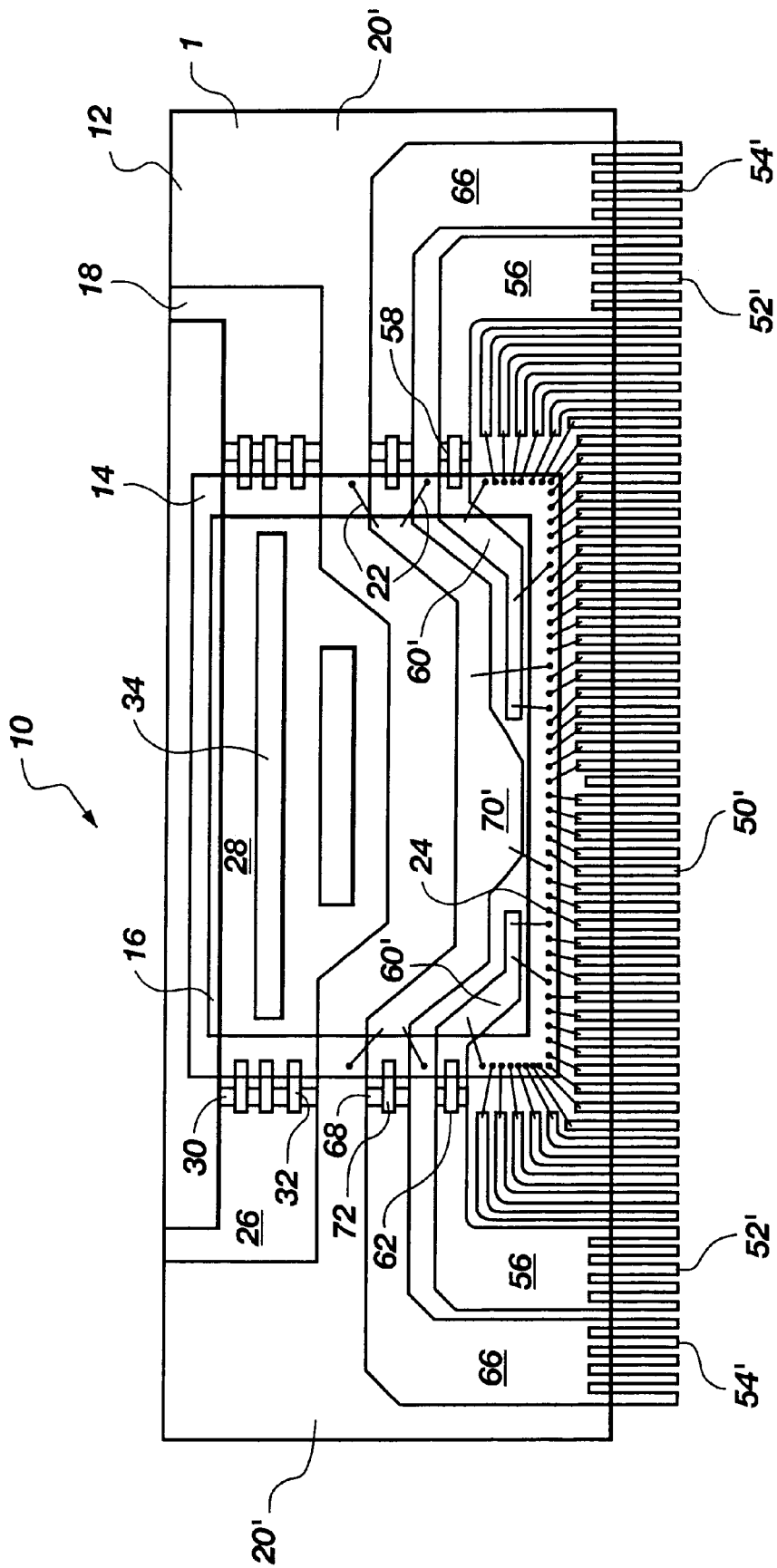
FIG. 4 is a side view of one side of a second embodiment of the present invention mounted in a vertical surface mount package.

Referring to drawing FIG. 4, the first side 1 of a second embodiment of the integrated circuit package 10 of the present invention is shown. The integrated circuit package 10 comprises a substrate 12, semiconductor device 14, insulating tape 16, semiconductor device retainer 18, lead frame 20', and wire bond interconnections 22. As illustrated, the semiconductor device 14 is a Leads-Over-Chip (LOC) configuration with respect to the lead frame 20'.

The substrate 12 comprises any suitable well known substrate for use with the semiconductor device 14. The semiconductor device 14 may be secured to the first side of the substrate 12 by any suitable means, such as adhesive attachment, if desired.

The semiconductor device 14 comprises any suitable type semiconductor device, such as Dynamic Random Access Memory (DRAM) dice, Static Random Access Memory (SRAM) dice, Synchronous DRAM (SDRAM) dice, Sequential Graphics Random Access Memory (SGRAM) dice, flash Electrically Erasable Programmable Read-Only Memory (EEPROM) dice, and processor dice. The semiconductor device 14 includes at least one or a plurality of bond pads 22 on the active surface thereof.

The insulating tape 16 comprises any suitable well known type insulating tape which may be adhesively coated to secure portions of the lead frame 20 thereto and the insulating tape 16 to the semiconductor device 14. A suitable type insulating tape includes Kapton™ tape which may be adhesively coated on one or both sides thereof.

The semiconductor device retainer 18 comprises a u-shaped member having a first portion 26 thereof extending along the first side of the substrate 12 in contact therewith, a second raised portion 28 thereof extending over a portion of the semiconductor device 14 and a portion of the insulating tape 16, and a third transition portion thereof 30 connecting the first portion 26 and second raised portion 28. The third transition portion 30 may be of any desired length depending upon the thickness of the semiconductor device 14 and the insulating tape 16. To aid in forming the third transition portion 30 between the first portion 26 and second raised portion 28 one or more slotted openings 32 are included in the semiconductor device retainer 18. If desired, other openings 34 may be included in the second raised portion 28 to aid in the forming thereof. Further, if desired, the second raised portion 28 of the semiconductor retainer device 18 may be adhesively attached to the insulating tape 16 through the use of well known suitable adhesives.

The lead frame 20' comprises a first plurality of leads 50, a second plurality of leads 52' commonly connected over a portion of the length thereof, and a third plurality of leads 54' commonly connected over a portion thereof. As illustrated, the second plurality of leads 52' is commonly connected forming a unitary lead including a first portion 56 generally contacting the substrate 12, second transition portion 58 having, in turn, slotted opening 62 therein, and third semiconductor device portions 60' which terminate at a distance overlaying a portion of the semiconductor device 14. The third semiconductor device portions 60' of the second plurality of leads 52' are insulated from electrical contact with the active surface of the semiconductor device 14 by the insulating tape 16. As illustrated, the third plurality of leads 54' is commonly connected, forming a unitary lead including a first portion 66 generally contacting the surface of the substrate 12, a second transition portion 68 having slotted opening 72 therein, and third semiconductor device portion 70' which has a portion thereof extending adjacent and/or in between the ends of the portions 60' of the leads 52'. The third semiconductor device portion 70' is insulated from the active surface of the semiconductor device 14 by the insulating tape 16. The transition portions 58 and 68 of the second plurality and third plurality of leads 52' and 54', respectively may be any desired length depending upon the thickness of the semiconductor device 14 and the insulating tape 16. The third semiconductor device portions 60' and 70' of the second plurality and third plurality of leads 52' and 54', respectively, are adhesively secured to the insulating tape 16 through the use of well known suitable adhesives.

As illustrated, the second plurality of leads 52' and third plurality of leads 54' are used for the $V_{cc}$ and $V_{ss}$ functions of the semiconductor device 14. In this manner, by commonly connecting the second plurality of leads 52' and third plurality of leads 54' in areas except the portions of the leads which extend beyond the substrate 12, the impedance of the commonly connected leads is reduced, thereby allowing semiconductor devices 14 having higher operating frequencies to be used in the integrated circuit package 10. Also, by commonly connecting the second plurality of leads 52' and third plurality of leads 54' in areas except the portions of the leads which extend beyond the substrate 12, the impedance of the second plurality 52' and third plurality 54' of leads is similar to that of the first plurality of leads 50.

A plurality of wire bond interconnections 22 interconnect the bond pads 24 on the active surface of the semiconductor device 14 and the first 50, second 52', and third 54' pluralities of leads. The wire bond interconnections 22 are made using suitable well known wire bonding devices.

Figure 5:
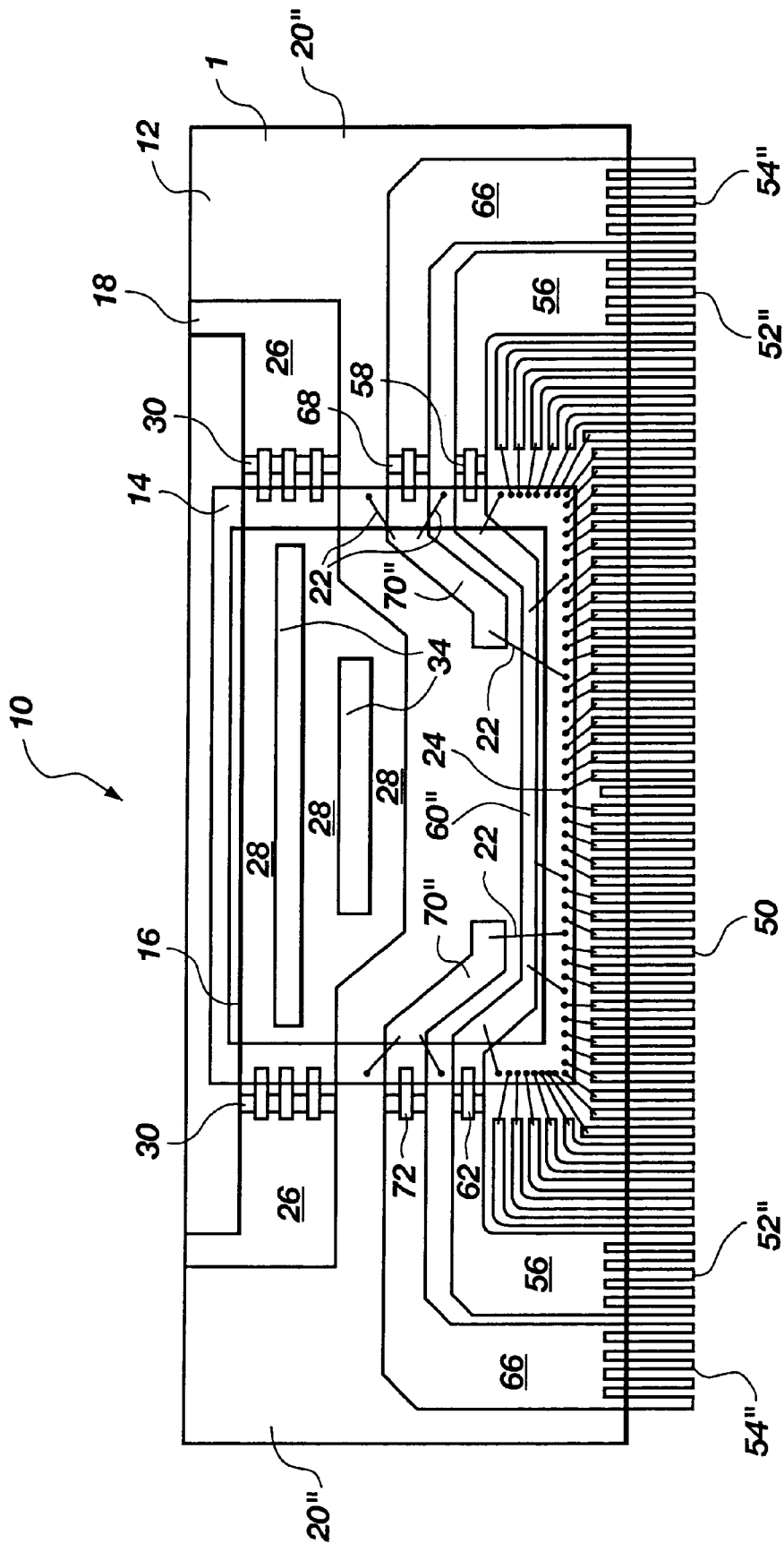
FIG. 5 is a side view of one side of a third embodiment of the present invention mounted in a vertical surface mount package.

Referring to drawing FIG. 5, the first side 1 of a third embodiment of the integrated circuit package 10 of the present invention is shown. The integrated circuit package 10 comprises a substrate 12, semiconductor device 14, insulating tape material 16, semiconductor device retainer 18, lead frame 20", and wire bond interconnections 22. As illustrated, the semiconductor device 14 is a Leads-Over-Chip (LOC) configuration with respect to the lead frame 20".

The substrate 12 comprises any suitable well known substrate for use with the semiconductor device 14. The semiconductor device 14 may be secured to the first side of the substrate 12 by any suitable means, such as adhesive attachment, if desired.

The semiconductor device 14 comprises any suitable type semiconductor device, such as Dynamic Random Access Memory (DRAM) dice, Static Random Access Memory (SRAM) dice, Synchronous DRAM (SDRAM) dice, Sequential Graphics Random Access Memory (SGRAM) dice, flash Electrically Erasable Programmable Read-Only Memory (EEPROM) dice, and processor dice. The semiconductor device 14 includes at least one or a plurality of bond pads 24 on the active surface thereof.

The insulating tape material 16 comprises any suitable well known type insulating tape which may be adhesively coated to secure portions of the lead frame 20" thereto and the insulating tape 16 to the semiconductor device 14. A suitable type insulating tape includes Kapton™ tape which may be adhesively coated on one or both sides thereof.

The semiconductor device retainer 18 comprises a u-shaped member having a first portion 26 thereof extending along the first side of the substrate 12 in contact therewith, a second raised portion 28 thereof extending over a portion of the semiconductor device 14 and a portion of the insulating tape 16, and a third transition portion thereof 30 connecting the first portion 26 and second raised portion 28. The third transition portion 30 may be of any desired length depending upon the thickness of the semiconductor device 14 and the insulating tape 16. To aid in forming the third transition portion 30 between the first portion 26 and second raised portion 28 one or more slotted openings 32 are included in the semiconductor device retainer 18. If desired, other openings 34 may be included in the second raised portion 28 to aid in the forming thereof. Further, if desired, the second raised portion 28 of the semiconductor retainer device 18 may be adhesively attached to the insulating tape 16 through the use of well known suitable adhesives.

The lead frame 20" comprises a first plurality of leads 50, a second plurality of leads 52" commonly connected over a portion of the length thereof, and a third plurality of leads 54" commonly connected over a portion thereof. As illustrated, the second plurality of leads 52" is commonly connected, forming a unitary lead including a first portion 56 generally contacting the substrate 12, second transition portion 58 having, in turn, slotted opening 62 therein, and third semiconductor device portion 60" overlaying a portion of the semiconductor device 14. The third semiconductor device portion 60" of the second plurality of leads 52" is insulated from electrical contact with the active surface of the semiconductor device 14 by the insulating tape 16. As illustrated, the third plurality of leads 54" are commonly connected, forming a unitary lead including a first portion 66 generally contacting the surface of the substrate 12, a second transition portion 68 having slotted opening 72 therein, and third semiconductor device portions 70" which have a portion thereof extending adjacent the portion 60" of the leads 52". The third semiconductor device portions 70" are insulated from the active surface of the semiconductor device 14 by the insulating tape 16. The transition portions 58 and 68 of the second plurality and third plurality of leads 52" and 54" respectively, may be any desired length depending upon the thickness of the semiconductor device 14 and the insulating tape 16. The third semiconductor device portions 60" and 70" of the second plurality and third plurality of leads 52" and 54" respectively are adhesively secured to the insulating tape 16 through the use of well known suitable adhesives.

As illustrated, the second plurality of leads 52" and third plurality of leads 54" are used for the $V_{cc}$ and $V_{ss}$ functions of the semiconductor device 14. In this manner, by commonly connecting the second plurality of leads 52" and third plurality of leads 54" in areas except the portions of the leads which extend beyond the substrate 12, the impedance of the commonly connected leads is reduced thereby allowing semiconductor devices 14 having higher operating frequencies to be used in the integrated circuit package 10. Also, by commonly connecting the second plurality of leads 52" and third plurality of leads 54" in areas except the portions of the leads which extend beyond the substrate 12 the impedance of the second plurality 52" and third plurality 54" of leads is similar to that of the first plurality of leads 50.

A plurality of wire bond interconnections 22 interconnect the bond pads 24 on the active surface of the semiconductor device 14 and the first 50, second 52", and third 54" pluralities of leads. The wire bond interconnections 22 are made using suitable well known wire bonding devices.

Figure 6:
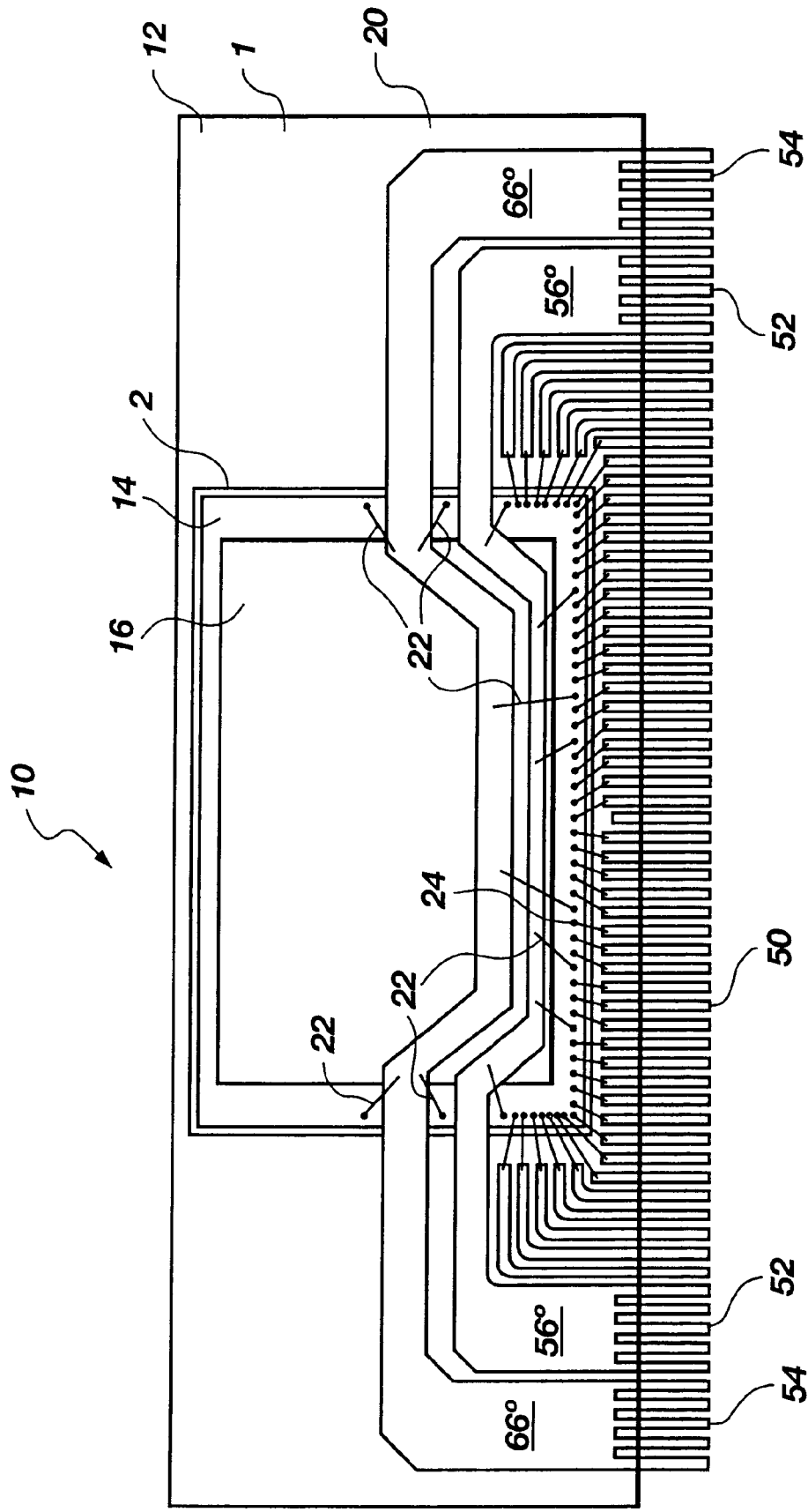
FIG. 6 is a side view of one side of a fourth embodiment of the present invention mounted in a vertical surface mount package.

Referring to drawing FIG. 6, the first side 1 of a fourth embodiment of the integrated circuit package 10 of the present invention is shown. The integrated circuit package 10 comprises a substrate 12, semiconductor device 14, insulating tape material 16, semiconductor device retainer 118 (shown in FIG. 7), lead frame 20, and wire bond interconnections 22. As illustrated, the semiconductor device 14 is a modified Leads-Over-Chip (LOC) configuration with respect to the lead frame 20.

The substrate 12 comprises any suitable well known substrate for use with the semiconductor device 14. The semiconductor device 14 is contained or received within an aperture 2 extending partially or completely therethrough to the other side 100 (see FIG. 7) of the substrate 12.

The semiconductor device 14 comprises any suitable type semiconductor device, such as Dynamic Random Access Memory (DRAM) dice, Static Random Access Memory (SRAM) dice, Synchronous DRAM (SDRAM) dice, Sequential Graphics Random Access Memory (SGRAM) dice, flash Electrically Erasable Programmable Read-Only Memory (EEPROM) dice, and processor dice. The semiconductor device 14 includes at least one or a plurality of bond pads 24 on the active surface thereof.

The insulating tape 16 comprises any suitable well known type insulating tape which may be adhesively coated to secure portions of the lead frame 20 thereto and the insulating tape 16 to the semiconductor device 14. A suitable type insulating tape includes Kapton™ tape which may be adhesively coated on one or both sides thereof. The insulating tape 16 extends over any desired portion of the active surface of the semiconductor device 14 for electrical insulation purposes of the active surface from the lead frame 20.

The lead frame 20 comprises a first plurality of leads 50, a second plurality of leads 52 commonly connected over a portion of the length thereof, and a third plurality of leads 54 commonly connected over a portion thereof. As illustrated, the second plurality of leads 52 is commonly connected forming a unitary lead including a first portion 56° generally overlaying a portion of the semiconductor device 14. The first portion 56° of the second plurality of leads 52 is insulated from electrical contact with the active surface of the semiconductor device 14 by the insulating tape 16. As illustrated, the third plurality of leads 54 is commonly connected, forming a unitary lead including a first portion 66° generally overlaying a portion of the semiconductor device 14. The first semiconductor device portion 66° is insulated from the active surface of the semiconductor device 14 by the insulating tape 16. The portions 56° and 66° of the second plurality and third plurality of leads 52 and 54 respectively, are adhesively secured to the substrate, if desired, and to the insulating tape 16 through the use of well known suitable adhesives.

As illustrated, the second plurality of leads 52 and third plurality of leads 54 are used for the $V_{cc}$ and $V_{ss}$ functions of the semiconductor device 14. In this manner, by commonly connecting the second plurality of leads 52 and third plurality of leads 54 in areas except the portions of the leads which extend beyond the substrate 12, the impedance of the commonly connected leads is reduced, thereby allowing semiconductor devices 14 having higher operating frequencies to be used in the integrated circuit package 10. Also, by commonly connecting the second plurality of leads 52 and third plurality of leads 54 in areas except the portions of the leads which extend beyond the substrate 12 the impedance of the second plurality 52 and third plurality of 54 of leads is similar to that of the first plurality of leads 50.

A plurality wire bond interconnections 22 interconnect the bond pads 24 on the active surface of the semiconductor device 14 and the first 50, second 52, and third 54 pluralities of leads. The wire bond interconnections 22 are made using suitable well known wire bonding devices.

Figure 7:
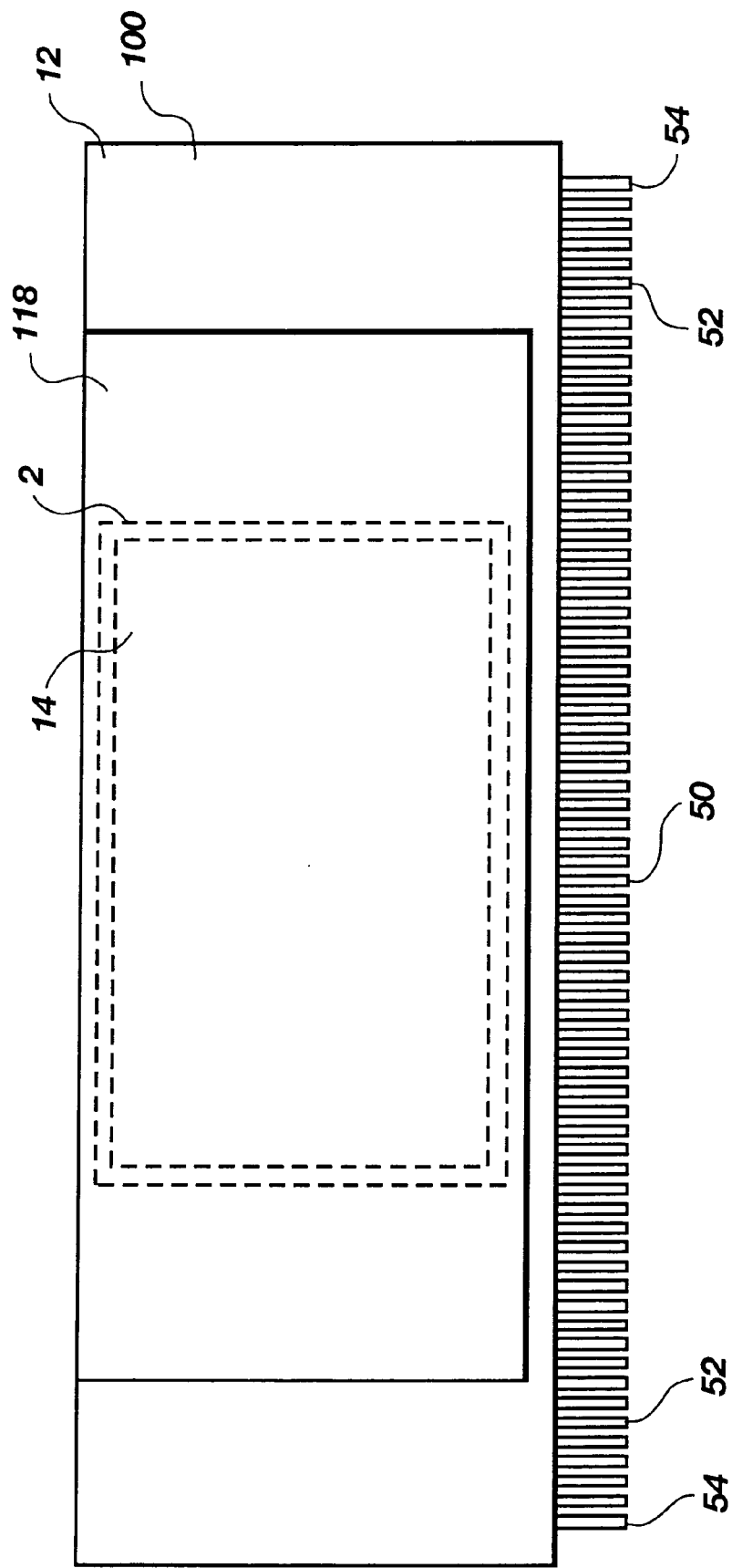
FIG. 7 is a side view of the other side of the fourth embodiment of the present invention mounted in a vertical surface mount package.

Referring to drawing FIG. 7, the second or other side 100 of the integrated circuit package 10 of the present invention shown in drawing FIG. 6 is illustrated. The semiconductor device retainer 118 to which the semiconductor device 14 is mounted through the use of suitable well known adhesives is illustrated in relation to the second or other side 100 of the integrated circuit package 10 and the aperture 2 therethrough. The semiconductor device retainer 118 is adhesively secured to the other side 100 of the integrated circuit package 10 by means of suitable well known adhesives. The semiconductor device retainer 118 may be made of any suitable material, such as metal, plastic, ceramic, etc. When the semiconductor retainer device is used as a heat sink for the semiconductor device 14 to conduct heat therefrom during operation, the semiconductor device is preferably made of a compatible metal or ceramic having a coefficient of expansion comparable to that of the semiconductor device 14. For such purposes, a silver epoxy may be used to adhesively secure the semiconductor device to the semiconductor retainer device 118.

Figure 8:
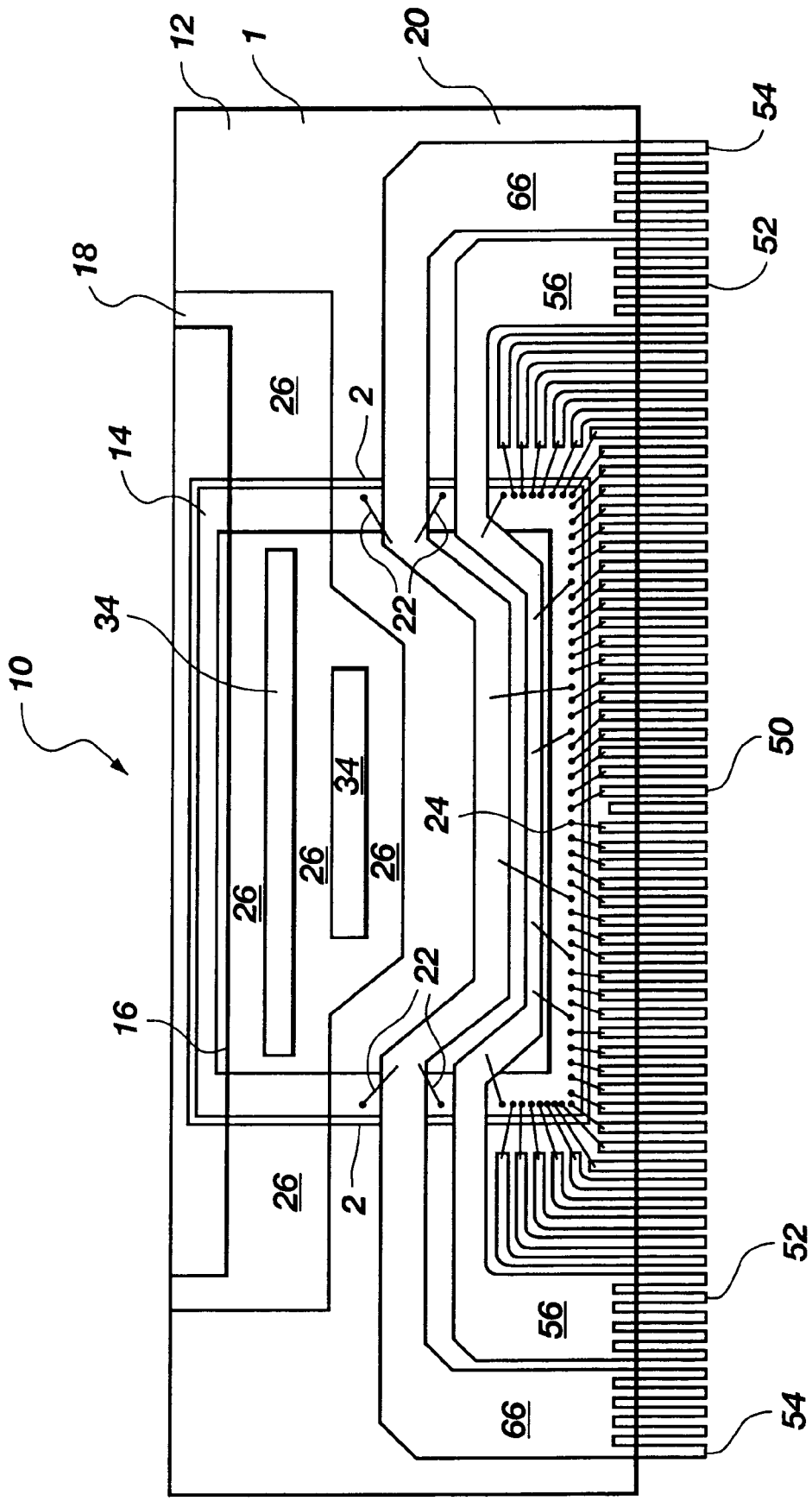
FIG. 8 is a side view of one side of a fifth embodiment of the present invention mounted in a vertical surface mount package.

Referring to drawing FIG. 8, the first side 1 of a fifth embodiment of the integrated circuit package 10 of the present invention is shown. The integrated circuit package 10 comprises a substrate 12, semiconductor device 14, insulating tape material 16, semiconductor device retainer 18, lead frame 20, and wire bond interconnections 22. As illustrated, the semiconductor device 14 is a modified Leads-Over-Chip (LOC) configuration with respect to the lead frame 20.

The substrate 12 comprises any suitable well known substrate for use with the semiconductor device 14. The semiconductor device 14 is contained or received within an aperture 2 extending partially or completely therethrough to the other side 100 (see FIG. 7) of the substrate 12.

The semiconductor device 14 comprises any suitable type semiconductor device, such as Dynamic Random Access Memory (DRAM) dice, Static Random Access Memory (SRAM) dice, Synchronous DRAM (SDRAM) dice, Sequential Graphics Random Access Memory (SGRAM) dice, flash Electrically Erasable Programmable Read-Only Memory (EEPROM) dice, and processor dice. The semiconductor device 14 includes at least one or a plurality of bond pads 24 on the active surface thereof.

The insulating tape 16 comprises any suitable well known type insulating tape which may be adhesively coated to secure portions of the lead frame 20 thereto and the insulating tape 16 to the semiconductor device 14. A suitable type insulating tape includes Kapton™ tape which may be adhesively coated on one or both sides thereof. The insulating tape 16 extends over any desired portion of the active surface of the semiconductor device 14 for electrical insulation purposes of the active surface from the lead frame 20.

The semiconductor device retainer 18 comprises a u-shaped member having a first portion 26 thereof extending along the first side of the substrate 12 in contact therewith and extending over a portion of the semiconductor device 14 having insulating tape 16 thereon. To aid in forming the first portion 26, one or more slotted openings 34 are included in the semiconductor device retainer 18. Further, if desired, the first portion 26 of the semiconductor retainer device 18 may be adhesively attached to the insulating tape 16 though the use of well known suitable adhesives. The portion (not shown in FIG. 8) of the semiconductor device retainer 18 contacting side 100 of the substrate 12 is as shown and described as semiconductor retainer device 118 in drawing FIG. 7.

The lead frame 20 comprises a first plurality of leads 50 secured to substrate 12 by any suitable well known means, such as adhesive bonding, a second plurality of leads 52 commonly connected over a portion of the length thereof, and a third plurality of leads 54 commonly connected over a portion thereof. As illustrated, the second plurality of leads 52 are commonly connected forming a unitary lead including a first portion 56 generally overlaying a portion of the semiconductor device 14. The first portion 56 of the second plurality of leads 52 is insulated from electrical contact with the active surface of the semiconductor device 14 by the insulating tape 16. As illustrated, the third plurality of leads 54 is commonly connected forming a unitary lead including a first portion 66 generally overlaying a portion of the semiconductor device 14. The first semiconductor device portion 66 is insulated from the active surface of the semiconductor device 14 by the insulating tape 16. The portions 56 and 66 of the second plurality and third plurality of leads 52 and 54, respectively are adhesively secured to the substrate, if desired, and to the insulating tape 16 through the use of well known suitable adhesives.

As illustrated, the second plurality of leads 52 and third plurality of leads 54 are used for the $V_{cc}$ and $V_{ss}$ functions of the semiconductor device 14. In this manner, by commonly connecting the second plurality of leads 52 and third plurality of leads 54 in areas except the portions of the leads which extend beyond the substrate 12 the impedance of the commonly connected leads is reduced, thereby allowing semiconductor devices 14 having higher operating frequencies to be used in the integrated circuit package 10. Also, by commonly connecting the second plurality of leads 52 and third plurality of leads 54 in areas except the portions of the leads which extend beyond the substrate 12, the impedance of the second plurality 52 and third plurality 54 of leads is similar to that of the first plurality of leads 50.

A plurality of wire bond interconnections 22 interconnect the bond pads 24 on the active surface of the semiconductor device 14 and the first 50, second 52, and third 54 pluralities of leads. The wire bond interconnections 22 are made using suitable well known wire bonding devices.

Figure 9:
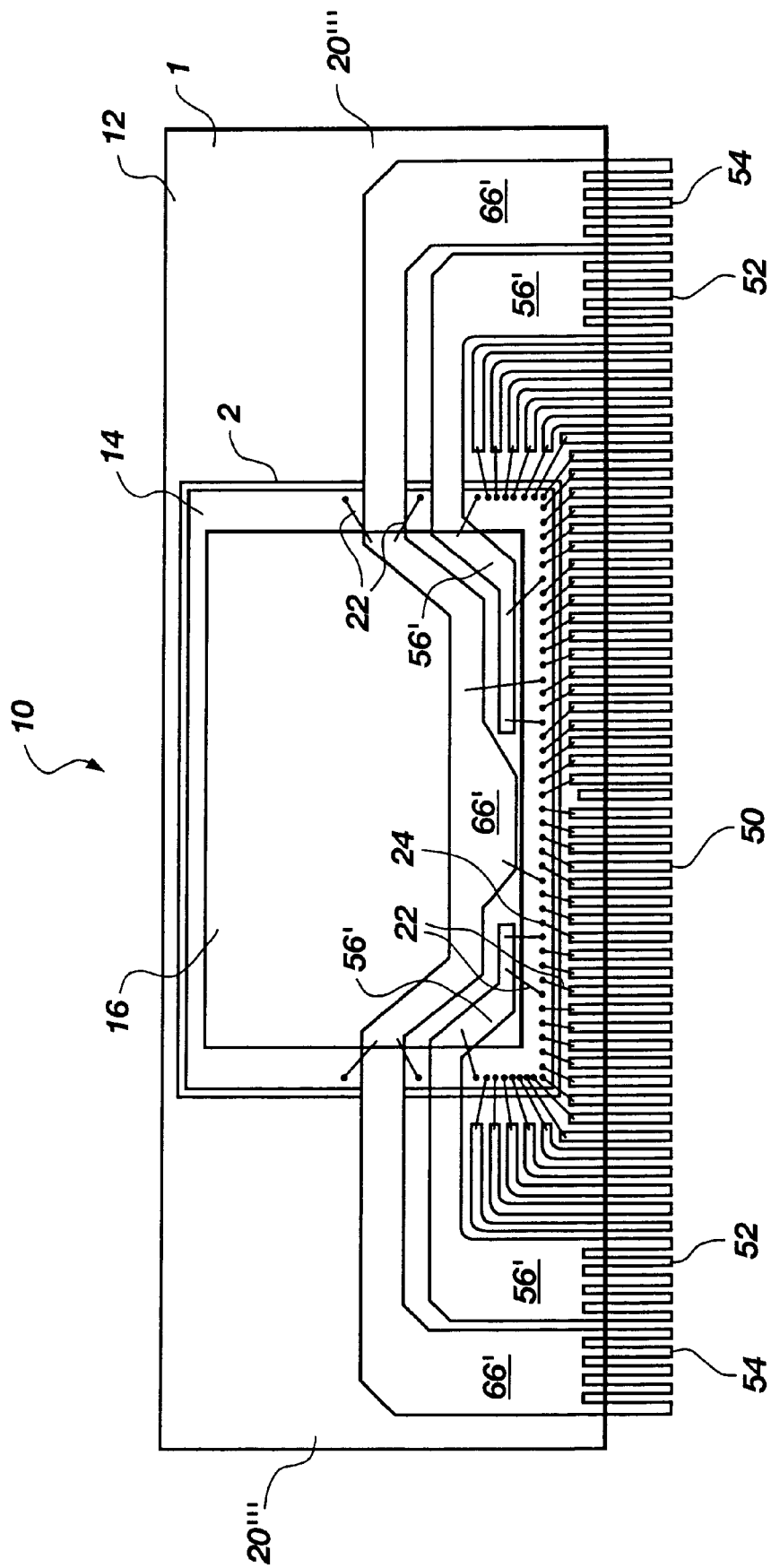
FIG. 9 is a side view of one side of a sixth embodiment of the present invention mounted in a vertical surface mount package.

Referring to drawing FIG. 9, the first side 1 of a sixth embodiment of the integrated circuit package 10 of the present invention is shown. The integrated circuit package 10 comprises a substrate 12, semiconductor device 14, insulating tape material 16, semiconductor device retainer 118 (see FIG. 7), lead frame 20''', and wire bond interconnections 22. As illustrated, the semiconductor device 14 is a modified Leads-Over-Chip (LOC) configuration with respect to the lead frame 20'''.

The substrate 12 comprises any suitable well known substrate for use with the semiconductor device 14. The semiconductor device 14 is contained or received within an aperture 2 extending partially or completely therethrough to the other side 100 (see FIG. 7) of the substrate 12.

The semiconductor device 14 comprises any suitable type semiconductor device, such as Dynamic Random Access Memory (DRAM) dice, Static Random Access Memory (SRAM) dice, Synchronous DRAM (SDRAM) dice, Sequential Graphics Random Access Memory (SGRAM) dice, flash Electrically Erasable Programmable Read-Only Memory (EEPROM) dice, and processor dice. The semiconductor device 14 includes at least one or a plurality of bond pads 24 on the active surface thereof.

The insulating tape material 16 comprises any suitable well known type insulating tape which may be adhesively coated to secure portions of the lead frame 20''' thereto and the insulating tape 16 to the semiconductor device 14. A suitable type insulating tape includes Kapton™ tape which may be adhesively coated on one or both sides thereof.

The lead frame 20''' comprises a first plurality of leads 50, a second plurality of leads 52 commonly connected over a portion of the length thereof, and a third plurality of leads 54 commonly connected over a portion thereof. As illustrated, the second plurality of leads 52 is commonly connected forming a unitary lead including a first portion 56' generally overlaying a portion of substrate 12 and the semiconductor device 14. The first portion 56' of the second plurality of leads 52 is insulated from electrical contact with the active surface of the semiconductor device 14 by the insulating tape 16. As illustrated, the third plurality of leads 54 is commonly connected, forming a unitary lead including a first portion 66' generally overlaying a portion of the substrate 12 and the semiconductor device 14. The first semiconductor device portion 66' is insulated from the active surface of the semiconductor device 14 by the insulating tape 16. The portions 56' and 66' of the second plurality and third plurality of leads 52 and 54, respectively, are adhesively secured to the substrate, if desired, and to the insulating tape 16 through the use of well known suitable adhesives.

As illustrated, the second plurality of leads 52 and third plurality of leads 54 are used for the $V_{cc}$ and $V_{ss}$ functions of the semiconductor device 14. In this manner, by commonly connecting the second plurality of leads 52 and third plurality of leads 54 in areas except the portions of the leads which extend beyond the substrate 12, the impedance of the commonly connected leads is reduced, thereby allowing semiconductor devices 14 having higher operating frequencies to be used in the integrated circuit package 10. Also, by commonly connecting the second plurality of leads 52 and third plurality of leads 54 in areas except the portions of the leads which extend beyond the substrate 12, the impedance of the second plurality 52 and third plurality 54 of leads is similar to that of the first plurality of leads 50.

A plurality of wire bond interconnections 22 interconnect the bond pads 24 on the active surface of the semiconductor device 14 and the first 50, second 52, and third 54 pluralities of leads. The wire bond interconnections 22 are made using suitable well known wire bonding devices.

Figure 10:
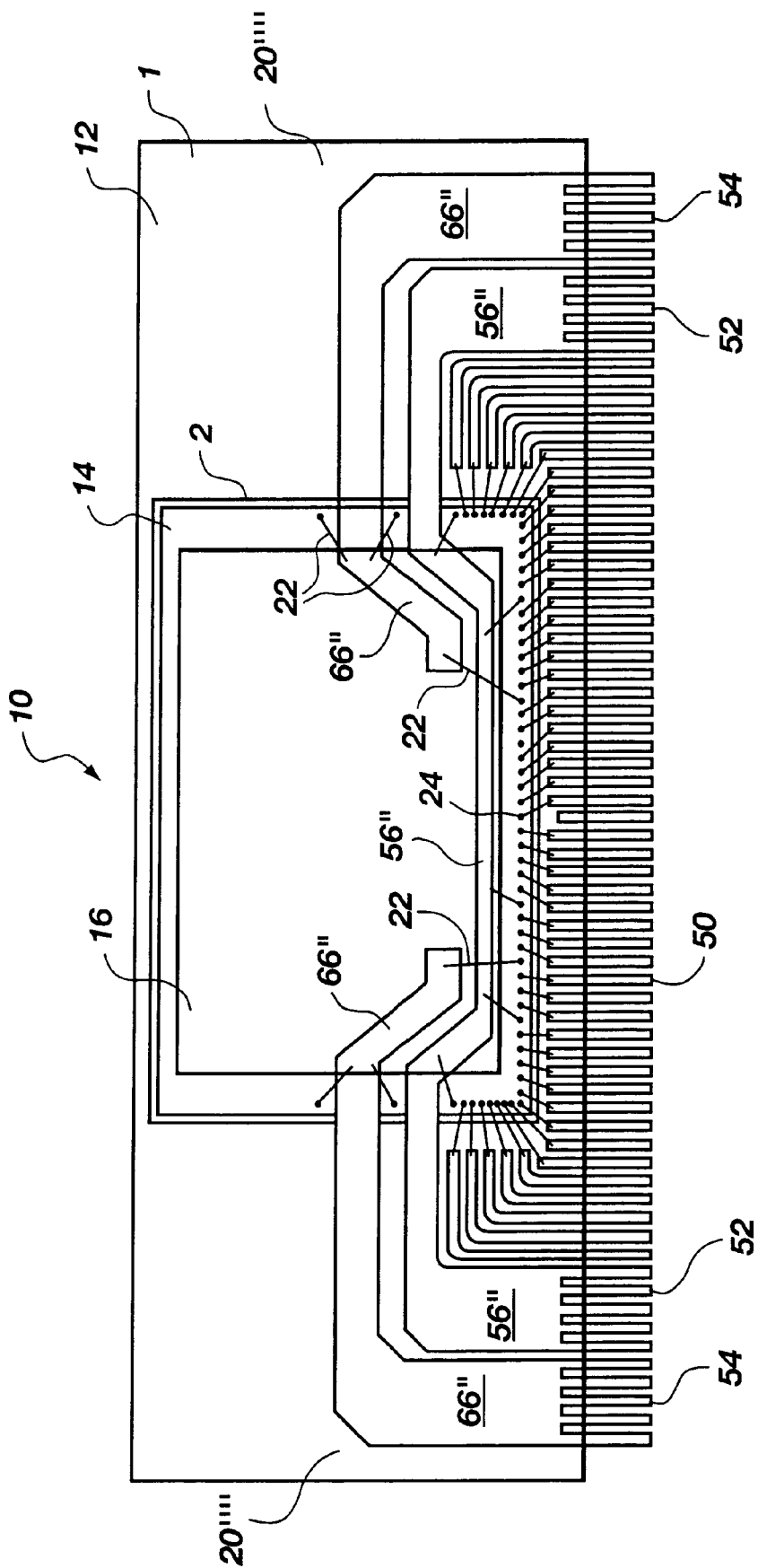
FIG. 10 is a side view of one side of a seventh embodiment of the present invention mounted in a vertical surface mount package.

Referring to drawing FIG. 10, the first side 1 of a seventh embodiment of the integrated circuit package 10 of the present invention is shown. The integrated circuit package 10 comprises a substrate 12, semiconductor device 14, insulating tape material 16, semiconductor device retainer 118 (see FIG. 7), lead frame 20'''', and wire bond interconnections 22. As illustrated, the semiconductor device 14 is a modified Leads-Over-Chip (LOC) configuration with respect to the lead frame 20''''.

The substrate 12 comprises any suitable well known substrate for use with the semiconductor device 14. The semiconductor device 14 is contained or received within an aperture 2 extending partially or completely therethrough to the other side 100 (see FIG. 7) of the substrate 12.

The semiconductor device 14 comprises any suitable type semiconductor device, such as Dynamic Random Access Memory (DRAM) dice, Static Random Access Memory (SRAM) dice, Synchronous DRAM (SDRAM) dice, Sequential Graphics Random Access Memory (SGRAM) dice, flash Electrically Erasable Programmable Read-Only Memory (EEPROM) dice, and processor dice. The semiconductor device 14 includes at least one or a plurality of bond pads 24 on the active surface thereof.

The insulating tape material 16 comprises any suitable well known type insulating tape which may be adhesively coated to secure portions of the lead frame 20'' thereto and the insulating tape 16 to the semiconductor device 14. A suitable type insulating tape includes Kapton™ tape which may be adhesively coated on one or both sides thereof.

The lead frame 20'''' comprises a first plurality of leads 50, a second plurality of leads 52 commonly connected over a portion of the length thereof, and a third plurality of leads 54 commonly connected over a portion thereof. As illustrated, the second plurality of leads 52 is commonly connected forming a lead including a first portion 56'' generally overlaying a portion of substrate 12 and the semiconductor device 14. The first portion 56'' of the second plurality of leads 52 is insulated from electrical contact with the active surface of the semiconductor device 14 by the insulating tape 16. As illustrated, the third plurality of leads 54 is commonly connected, forming a lead including a first portion 66'' generally overlaying a portion of the substrate 12 and the semiconductor device 14. The first semiconductor device portion 66'' is insulated from the active surface of the semiconductor device 14 by the insulating tape 16. The portions 56'' and 66'' of the second plurality and third plurality of leads 52 and 54, respectively, are adhesively secured to the substrate, if desired, and to the insulating tape 16 through the use of well known suitable adhesives.

As illustrated, the second plurality of leads 52 and third plurality of leads 54 are used for the $V_{cc}$ and $V_{ss}$ functions of the semiconductor device 14. In this manner, by commonly connecting the second plurality of leads 52 and third plurality of leads 54 in areas except the portions of the leads which extend beyond the substrate 12, the impedance of the commonly connected, leads is reduced thereby allowing semiconductor devices 14 having higher operating frequencies to be used in the integrated circuit package 10. Also, by commonly connecting the second plurality of leads 52 and third plurality of leads 54 in areas except the portions of the leads which extend beyond the substrate 12, the impedance of the second plurality 52 and third plurality 54 of leads is similar to that of the first plurality of leads 50.

A plurality of wire bond interconnections 22 interconnect the bond pads 24 on the active surface of the semiconductor device 14 and the first 50, second 52, and third 54 pluralities of leads. The wire bond interconnections 22 are made using suitable well known wire bonding devices.

Figure 11:
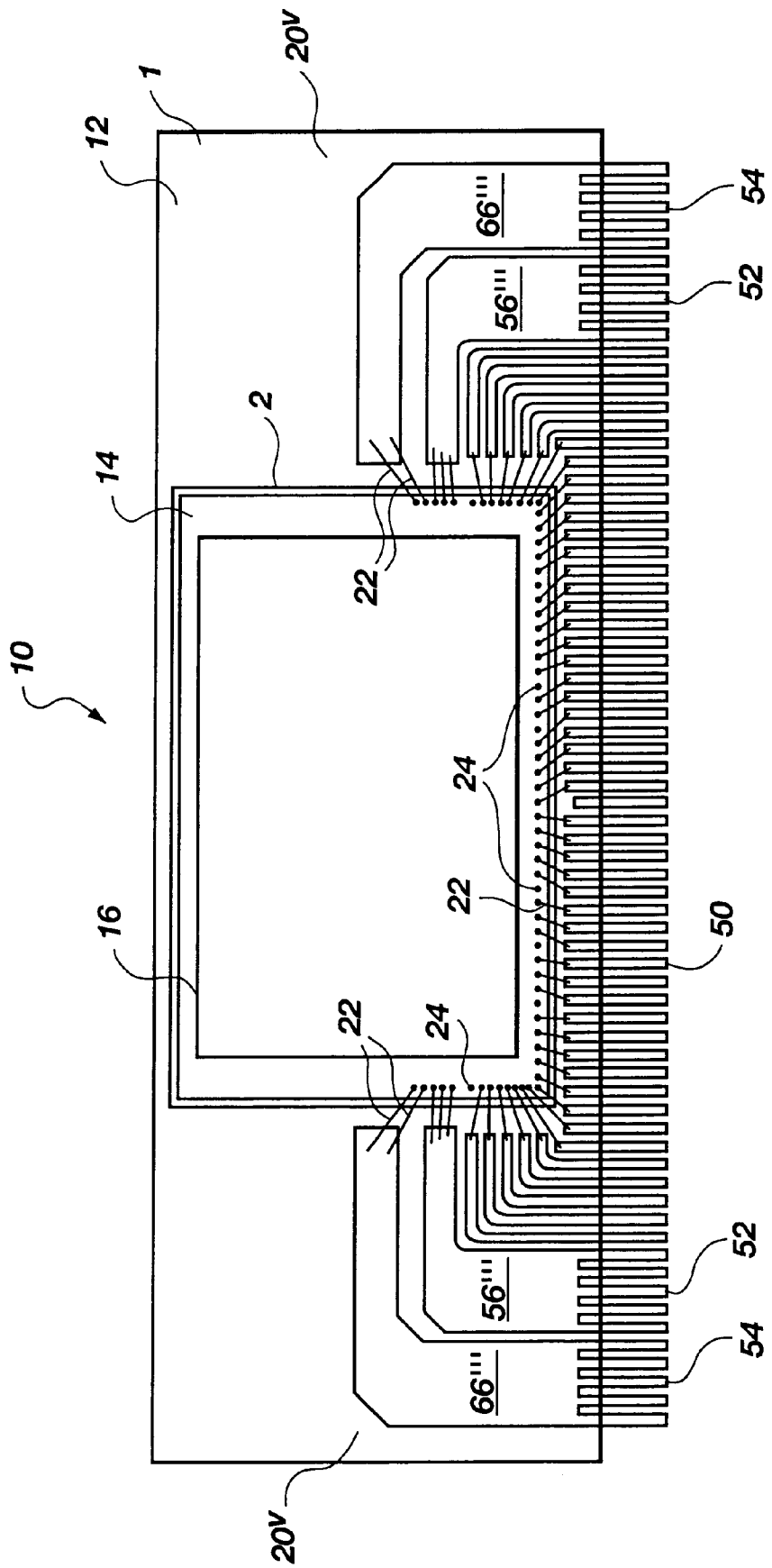
FIG. 11 is a side view of one side of an eighth embodiment of the present invention mounted in a vertical surface mount package.

Referring to drawing FIG. 11, the first side 1 of an eighth embodiment of the integrated circuit package 10 of the present invention is shown. The integrated circuit package 10 comprises a substrate 12, semiconductor device 14, insulating covering or coating 16 on the semiconductor device 14, semiconductor device retainer 118 (see FIG. 7), lead frame 20$^V$, and wire bond interconnections 22. As illustrated, the semiconductor device 14 is a conventional lead frame configuration with respect to the lead frame 20$^V$.

The substrate 12 comprises any suitable well known substrate for use with the semiconductor device 14. The semiconductor device 14 is contained or received within an aperture 2 extending partially or completely therethrough to the other side 100 (see FIG. 7) of the substrate 12.

The semiconductor device 14 comprises any suitable type semiconductor device, such as Dynamic Random Access Memory (DRAM) dice, Static Random Access Memory (SRAM) dice, Synchronous DRAM (SDRAM) dice, Sequential Graphics Random Access Memory (SGRAM) dice, flash Electrically Erasable Programmable Read-Only Memory (EEPROM) dice, and processor dice. The semiconductor device 14 includes at least one or a plurality of bond pads 24 on the active surface thereof.

The insulating covering or coating 16 comprises any suitable well known type insulating covering (tape) or coating, such as spun-on-glass, which may be attached or coated to portions of the semiconductor device 14. A suitable type insulating tape includes Kapton™ tape which may be adhesively coated on one or both sides thereof.

The lead frame 20' comprises a first plurality of leads 50, a second plurality of leads 52 commonly connected over a portion of the length thereof, and a third plurality of leads 54 commonly connected over a portion thereof. As illustrated, the second plurality of leads 52 is commonly connected forming a lead including a first portion 56''' generally overlaying a portion of substrate 12. The first portion 56''' of the second plurality of leads 52, if desired, may be insulated from electrical contact with the substrate 12 by any well known suitable means. As illustrated, the third plurality of leads 54 are commonly connected forming a lead including a first portion 66''' generally overlaying a portion of the substrate 12. The first semiconductor device portion 66''' is insulated from the surface of the substrate 12 by any suitable well known means. The portions 56''' and 66''' of the second plurality and third plurality of leads 52 and 54, respectively, may be adhesively secured to the substrate, if desired, through the use of well known suitable adhesives.

As illustrated, the second plurality of leads 52 and third plurality of leads 54 are used for the $V_{cc}$ and $V_{ss}$ functions of the semiconductor device 14. In this manner, by commonly connecting the second plurality of leads 52 and third plurality of leads 54 in areas except the portions of the leads which extend beyond the substrate 12, the impedance of the commonly connected, leads is reduced thereby allowing semiconductor devices 14 having higher operating frequencies to be used in the integrated circuit package 10. Also, by commonly connecting the second plurality of leads 52 and third plurality of leads 54 in areas except the portions of the leads which extend beyond the substrate 12 the impedance of the second plurality 52 and third plurality 54 of leads is similar to that of the first plurality of leads 50.

A plurality of wire bond interconnections 22 interconnect the bond pads 24 on the active surface of the semiconductor device 14 and the first 50, second 52, and third 54 pluralities of leads. The wire bond interconnections 22 are made using suitable well known wire bonding devices.

From the foregoing it will be understood that changes, additions, deletions, and modifications may be made to the present invention hereinbefore described which fall within the scope of the claimed invention, such as the shape of the lead frame, shape of the semiconductor device, location of bond pads on the semiconductor device, the common unitary portions of the leads terminating over the semiconductor device, the common unitary portions of the leads terminating adjacent the semiconductor device, etc.

What is claimed is:

1. A semiconductor device package assembly comprising:
a substrate having a first side and a second side thereof;
a semiconductor device connected to the substrate, the semiconductor device having an active surface and at least one bond pad located thereon;
insulation material covering a portion of the active surface of the semiconductor device, the insulation material covering the portion of the active surface of the semiconductor device including one of tape and an adhesive layer;
a semiconductor device retainer retaining the semiconductor device in relation to the substrate, the semiconductor device retainer having a portion engaging the first side of the substrate, a portion engaging the second side of the substrate, and a portion engaging a portion of the active surface of the semiconductor device;
a lead frame having at least one lead thereon; and
at least one wire bond interconnection between at least one lead of the lead frame and the at least one bond pad of the semiconductor device.

2. A semiconductor device package assembly comprising:
a substrate having a first side and a second side thereof;
a semiconductor device connected to the substrate, the semiconductor device having an active surface and at least one bond pad located thereon;
insulation material covering a portion of the active surface of the semiconductor device;
a semiconductor retainer device retaining the semiconductor device in relation to the substrate, the semiconductor device retainer engaging a portion of the active surface of the semiconductor device and a portion of the second side of the substrate[,]
a lead frame having at least one lead thereon; and
at least one wire bond interconnection between the at least one lead of the lead frame and the at least one bond pad of the semiconductor device.

3. A semiconductor device package assembly comprising:
a substrate having a first side and a second side thereof;
a semiconductor device connected to the substrate, the semiconductor device having an active surface and at least one bond pad located thereon;
insulation material covering a portion of the active surface of the semiconductor device;
a semiconductor retainer device retaining the semiconductor device in relation to the substrate, the semiconductor device retainer engaging a portion of the insulation material covering a portion of the active surface of the semiconductor device and engaging a portion of the first side and the second side of the substrate;
a lead frame having at least one lead thereon; and
at least one wire bond interconnection between at least one lead of the lead frame and the at least one bond pad of the semiconductor device.

4. A semiconductor device package assembly comprising:
a substrate having a first side and a second side thereof;
a semiconductor device connected to the substrate, the semiconductor device having an active surface and at least one bond pad located thereon;
insulation material covering a portion of the active surface of the semiconductor device;
a semiconductor retainer device retaining the semiconductor device in relation to the substrate, said semiconductor retainer device engaging a portion of the second side of the substrate and engaging a portion of the active surface of the semiconductor device;
a lead frame having at least one lead thereon, the lead frame including a first plurality of leads, a second plurality of leads having a portion thereof connected together to form a substantially unitary lead, and a third plurality of leads having a portion thereof connected together to form a substantially unitary lead, at least a portion of the unitary lead portion of the second plurality of leads and a portion of the unitary lead portion of the third plurality of leads extending over a portion of the active surface of the semiconductor device; and at least one wire bond interconnection between the at least one lead of the lead frame and the at least one bond pad of the semiconductor device.

5. A semiconductor device package assembly comprising:

a substrate having a first side and a second side thereof;

a semiconductor device connected to the substrate, the semiconductor device having an active surface and at least one bond pad located thereon;

insulation material covering a portion of the active surface of the semiconductor device;

a semiconductor retainer device retaining the semiconductor device in relation to the substrate, the semiconductor retainer device engaging a portion of the second side of the substrate and a portion of the active surface of the semiconductor device;

a lead frame having at least one lead thereon, the lead frame including a first plurality of leads, a second plurality of leads having a portion thereof connected together to form a substantially unitary lead terminating adjacent the semiconductor device, and a third plurality of leads having a portion thereof connected together to form a substantially unitary lead terminating adjacent the semiconductor device; and at least one wire bond interconnection between at least one lead of the lead frame and the at least one bond pad of the semiconductor device.

6. A semiconductor device package assembly comprising:

a substrate having a first side and a second side thereof;

a semiconductor device connected to the substrate, the semiconductor device having an active surface and at least one bond pad located thereon;

insulation material covering a portion of the active surface of the semiconductor device;

a semiconductor retainer device retaining the semiconductor device in relation to the substrates the semiconductor retainer device engaging a portion of the second side of the substrate and engaging a portion of the active surface of the semiconductor device;

a lead frame having at least one lead thereon, the lead frame including a first plurality of leads, a second plurality of leads having a portion thereof connected together to form a substantially unitary lead, the portion of the unitary lead portion of the second plurality of leads extending over a portion of the semiconductor device and terminating thereover, and a third plurality of leads having a portion thereof connected together to form a substantially unitary lead, a portion of the unitary lead portion of the third plurality of leads extending over a portion of the active surface of the semiconductor device; and at least one wire bond interconnection between the at least one lead of the lead frame and the at least one bond pad of the semiconductor device.

7. A semiconductor device package assembly comprising:

a substrate having a first side and a second side thereof;

a semiconductor device connected to the substrate, the semiconductor device having an active surface and at least one bond pad located thereon;

insulation material covering a portion of the active surface of the semiconductor device;

a semiconductor retainer device retaining the semiconductor device in relation to the substrates the semiconductor retainer device engaging a portion of the second side of the substrate and engaging a portion of the active surface of the semiconductor device;

a lead frame having at least one lead thereon, the lead frame including a first plurality of leads, a second plurality of leads having a portion thereof connected together to form a substantially unitary lead, the unitary lead portion of the second plurality of leads extending over a portion of the semiconductor device, and a third plurality of leads having a having a portion thereof connected together to form a substantially unitary lead, a portion of the unitary lead portion of the third plurality of leads extending over a portion of the active surface of the semiconductor device and terminating thereover; and at least one wire bond interconnection between the at least one lead of the lead frame and the at least one bond pad of the semiconductor device.

8. A semiconductor device package assembly comprising:

a substrate having a first side and a second side thereof;

a semiconductor device connected to the substrate, the semiconductor device having an active surface and at least one bond pad located thereon;

insulation material covering a portion of the active surface of the semiconductor device;

a semiconductor retainer device retaining the semiconductor device in relation to the substrate, the semiconductor retainer device engaging a portion of the second side of the substrate and a portion of the active surface of the semiconductor device;

a lead frame having at least one lead thereon, the lead frame including a first plurality of leads, a second plurality of leads having a portion thereof connected together overlaying a portion of the semiconductor device, and a third plurality of leads having a portion thereof connected together overlaying a portion of the semiconductor device; and at least one wire bond interconnection between the at least one lead of the lead frame and the at least one bond pad of the semiconductor device.

9. A semiconductor device package assembly comprising:

a substrate having a first side and a second side thereof;

a semiconductor device connected to the substrate, the semiconductor device having an active surface and at least one bond pad located thereon;

insulation material covering a portion of the active surface of the semiconductor device;

a semiconductor retainer device retaining the semiconductor device in relation to the substrate, the semiconductor retainer device engaging a portion of the second side of the substrate and a portion of the active surface of the semiconductor device;

a lead frame having at least one lead thereon, the lead frame including a first plurality of leads terminating adjacent the semiconductor device, a second plurality of leads having a portion thereof connected together overlaying a portion of the semiconductor device, and a third plurality of leads having a portion thereof connected together overlaying a portion of the semiconductor device; and at least one wire bond interconnection between the at least one lead of the lead frame and the at least one bond pad of the semiconductor device.

* * * * *

UNITED STATES PATENT AND TRADEMARK OFFICE
CERTIFICATE OF CORRECTION

PATENT NO. : 6,133,622
DATED : October 17, 2000
INVENTOR(S) : David J. Corisis and Brent Keeth It is certified that error appears in the above-identified patent and that said Letters Patent is hereby corrected as shown below:

<u>Title page,</u>
Item [56], References Cited, U.S. PATENT DOCUMENTS, before "8/1993", insert -- * --, before "12/1996", insert -- * --, insert -- cited by examiner* --, -- 5, 214,845 6/1993 King et al. --; and -- 5,559, 306 9/1996 Mahulikar --.
Item [57], ABSTRACT,
Line 8, change "desire" to -- desired --.

<u>Column 3,</u>
Line 47, after "tape" delete "material"
Line 65, after "pads" change "22" to -- 24 --
Line 66, delete "material"

<u>Column 4,</u>
Line 10, change "thereof 30" to -- 30 thereof --

<u>Column 5,</u>
Line 17, change "connectors" to -- leads --
Line 43, change "22" to -- 24 --
Line 55, change "thereof 30" to -- 30 thereof --
Line 61, insert a comma after "28"
Lines 65-66, change "retainer device" to -- device retainer --

<u>Column 6,</u>
Line 1, change "50" to -- 50' --
Line 5, insert a comma after "connected"
Line 46, change "50" to -- 50' --
Line 53, delete "material"

<u>Column 7,</u>
Line 6, delete "material"
Line 17, change "thereof 30" to -- 30 thereof --
Line 23, insert a comma after "28"
Lines 27 - 28, change "retainer device" to -- device retainer --
Line 43, change "are" to -- is --
Line 57, insert a comma after "54" and insert a comma after "respectively"
Line 66, insert a comma after "reduced"

UNITED STATES PATENT AND TRADEMARK OFFICE
CERTIFICATE OF CORRECTION

PATENT NO.     : 6,133,622
DATED          : October 17, 2000
INVENTOR(S)    : David J. Corisis and Brent Keeth It is certified that error appears in the above-identified patent and that said Letters Patent is hereby corrected as shown below:

Column 8,
Line 4, insert a comma after "12"
Line 16, delete "material"
Line 61, insert a comma after "54"

Column 9,
Line 9, insert a comma after "12"
Line 10, before "54" delete "of"
Line 36, change "retainer device" to -- device retainer --
Line 41, delete "material"

Column 10
Line 10, change "retainer device" to -- device retainer --
Line 11, change "though" to -- through --
Line 15, change "retainer device" to -- device retainer --
Line 23, after "52" change "are" to -- is -- and insert a comma after "connected"
Line 35, insert a comma after "respectively
Line 43, insert a comma after "12"
Line 61, delete "material"

Column 11,
Line 13, before "16" delete "material"
Line 23, insert a comma after "connected"
Line 62, delete "material"

Column 12,
Line 13, delete "material"
Line 15, change "20" to -- 20"" --
Line 23, insert a comma after "connected"
Line 45, delete the comma after "connected" and insert a comma after "reduced"
Line 60, change "coating" to -- tape --

Column 13,
Line 12, change "coating" to -- tape --
Line 22, insert a comma after "connected"
Line 42, delete the comma after "connected" and insert a comma after "reduced"

UNITED STATES PATENT AND TRADEMARK OFFICE
CERTIFICATE OF CORRECTION

PATENT NO. : 6,133,622
DATED : October 17, 2000
INVENTOR(S) : David J. Corisis and Brent Keeth It is certified that error appears in the above-identified patent and that said Letters Patent is hereby corrected as shown below:

Column 14,
Line 23, before "retaining" change "retainer device" to -- device retainer --
Line 27, change "[,]" to -- ; --
Line 39, before "retaining" change "retainer device" to -- device retainer --
Line 56, before "retaining" change "retainer device" to -- device retainer --
Line 58, change "retainer device" to -- device retainer --

Column 15,
Line 17, change "retainer device" to -- device retainer --
Line 19, change "retainer device" to -- device retainer --
Line 30, after "between" insert -- the --
Line 40, change "retainer device" to -- device retainer --
Line 41, change "substrates" to -- substrate,--
Line 42, change "retainer device" to -- device retainer --

Column 16,
Line 1, change "retainer device" to -- device retainer --
Line 2, change "substrates" to -- substrate --
Lines 3, 27, 29, 49 and 51, change "retainer device" to -- device retainer --

Signed and Sealed this

Third Day of August, 2004

JON W. DUDAS
*Acting Director of the United States Patent and Trademark Office*